United States Patent [19]

Sue et al.

[11] Patent Number: 4,839,245

[45] Date of Patent: Jun. 13, 1989

[54] ZIRCONIUM NITRIDE COATED ARTICLE AND METHOD FOR MAKING SAME

[75] Inventors: Jiinjen A. Sue, Indianapolis; Harden H. Troue, Plainfield, both of Ind.

[73] Assignee: Union Carbide Corporation, Danbury, Conn.

[21] Appl. No.: 159,545

[22] Filed: Feb. 22, 1988

Related U.S. Application Data

[63] Continuation of Ser. No. 911,510, Sep. 25, 1986, abandoned, which is a continuation-in-part of Ser. No. 905,510, Sep. 10, 1986, which is a continuation-in-part of Ser. No. 781,459, Sep. 30, 1985, abandoned.

[51] Int. Cl.$^4$ .................... B23P 15/02; B23P 15/04
[52] U.S. Cl. ........................... 428/698; 428/469; 428/472; 428/699; 29/DIG. 45
[58] Field of Search ............. 428/698, 699, 469, 472; 29/DIG. 45

[56] References Cited

U.S. PATENT DOCUMENTS

| | | | |
|---|---|---|---|
| 3,537,891 | 11/1970 | Rairden | 428/698 X |
| 3,625,848 | 12/1971 | Snaper | 204/192 |
| 3,699,623 | 10/1972 | Kreider | 29/156.8 B |
| 3,748,110 | 7/1973 | Hodshire et al. | 29/197 |
| 3,772,174 | 11/1973 | Spalvins | 204/192 |
| 3,783,231 | 1/1974 | Sablev et al. | 219/123 |
| 3,793,179 | 2/1974 | Sablev et al. | 204/298 |
| 3,801,353 | 4/1974 | Brill-Edwards | 117/71 M |
| 3,836,451 | 9/1974 | Snaper | 204/298 |
| 3,922,214 | 11/1975 | Van Cakenberghe | 204/298 |
| 3,961,103 | 6/1976 | Aisenberg | 427/39 |
| 4,123,595 | 10/1978 | Chang | 428/667 |
| 4,132,624 | 1/1979 | King et al. | 204/298 |
| 4,169,913 | 10/1979 | Kobayashi et al. | 428/698 X |
| 4,197,175 | 4/1980 | Moll et al. | 204/192 R |
| 4,277,222 | 7/1981 | Barbeau | 415/177 |
| 4,288,306 | 9/1981 | Kieferle et al. | 204/192 |
| 4,318,672 | 3/1982 | Hansen | 416/224 |
| 4,418,124 | 11/1983 | Jackson et al. | 428/548 |
| 4,448,799 | 5/1984 | Bergman et al. | 427/37 |
| 4,492,522 | 1/1985 | Rossmann et al. | 416/241 R |
| 4,505,947 | 3/1985 | Vukanovic et al. | 427/34 |
| 4,512,867 | 4/1985 | Andreev et al. | 204/298 |
| 4,525,415 | 6/1985 | Porat | 428/216 |
| 4,565,747 | 1/1986 | Nakae et al. | 428/698 |
| 4,590,090 | 5/1986 | Siemers et al. | 427/34 |

FOREIGN PATENT DOCUMENTS

| | | | |
|---|---|---|---|
| 14137 | 4/1980 | Japan | |
| 0106586 | 7/1982 | Japan | 428/698 |
| 182962 | 10/1984 | Japan | |

OTHER PUBLICATIONS

R. G. Duckworth et al., "Ion Bombardment of Group IV Elemental Metal and Synthetic Nitride Films", *Thin Solid Films*, 63 (1979), 289–297.

H. J. Kolkman, "Erosion of Corrosion Resistant Coatings for Jet Engine Compressors", Proc. 6th Int. Conf. on Erosion by Liquid and Solid Impact.

William D. Sproul, "Very High Rate Reactive Sputtering of TiN, ZrN and HfN", *Thin Solid Films*, 107 (1983), 141–147.

K. Salmenoja et al., "The Use of Optical Emisson Spectroscopy for Process Control in Triode Ion Plating with ZrN", *Vacuum*, vol. 36, Nos. 1–3, 33–35, 1986.

William D. Sproul, "Hafnium Nitride Coatings Prepared by Very High Rate Reactive Sputtering", *Thin Solid Films*, 118 (1984), 279–284.

William D. Sproul et al., "Reactively Sputtered TiN, ZrN, and HfN", Invited Paper, Extended Abstract, 1984 AVS National Symposium, Reno, Nev.

*Primary Examiner*—Nancy A. B. Swisher
*Attorney, Agent, or Firm*—James L. Sonntag

[57] ABSTRACT

An erosion resistant article such as a turbine blade having, in use, a surface subject to high angle impingement and a surface subject to low angle impingement, said article comprising a substrate defining said surfaces composed of a refractory metal, titanium alloy, refractory alloy, aluminum alloy, superalloy based on Fe, Co or Ni, stainless steel or ceramic composite, and an erosion-resistant coating of zirconium nitride having an averge grain size of not greater than about 3000 Angstroms applied by physical vapor deposition to said surfaces, said zirconium nitride coating preferably having a ratio of the erosion rate at an impingement angle of 90° to the erosion rate at an impingement angle of 20° of not greater than about 1.5 and having an erosion rate at all impingement angles from 20° to 90° at least about two times less than that of said substrate at the same impingement angles.

18 Claims, 5 Drawing Sheets

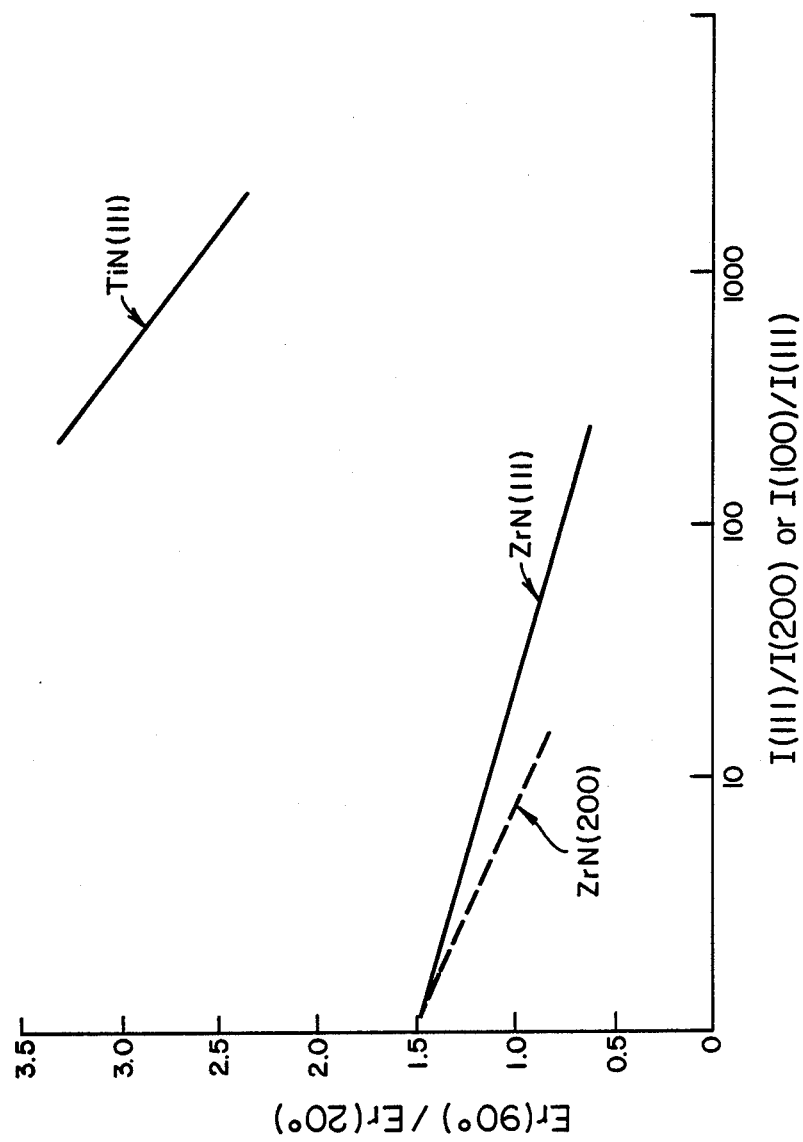

ZIRCONIUM NITRIDE COATED ARTICLE AND METHOD FOR MAKING SAME

This application is a continuation of Ser. No. 911,510 filed Sept. 25, 1986, now abandoned, which is a continuation-in-part of Ser. No. 905,510, filed Sept. 10, 1986, which is a continuation-in-part of Ser. No. 781,459 filed Sept. 30, 1985, now abandoned.

FIELD OF THE INVENTION

This invention relates to erosion resistant, zirconium nitride coated articles and, more particularly relates to erosion resistant, zirconium nitride coated airfoil surfaces of fan blades, compressor blades, turbine blades, impellers, stationary airfoils, e.g., vanes and diffusers.

BACKGROUND OF THE INVENTION

Erosion caused by airborne particles is a severe problem in the operation of a turbomachine in an environment of airborne abrasive particles, such as, ash, dust or sand. Erosion generally occurs on airfoil surfaces of turbomachine blades, impellers or vanes which are subjected to impacts of incoming ash, dust and/or sand. The 90° erosion damage, i.e., damage resulting from sand, dust or ash particles striking the airfoil surface head-on, e.g., or at a 90° angle, occurs primarily at the leading edge of the airfoil surface, while the low angle erosion damage, i.e., damage resulting from sand, dust or ash particles striking the airfoil surface at an angle less than 90°, e.g., at a 20° or 30° angle, appears primarily on the airfoil pressure surface and t railing edge. The former leads to a decrease in the cord width and/or geometrical distortion of the leading edge of the airfoil surface; and the latter results in a pitted and roughened pressure surface of the airfoil and/or loss of cord width due to eroding away of the airfoil trailing edge, which is generally thin. As a result of erosion, the aerodynamic performance of the airfoil is drastically reduced and the useful airfoil life is shortened.

Heretofore, fan, compressor or turbine airfoils have been coated or made with a wide variety of erosion-resistance materials to improve their resistance to erosion caused by abrasive particles, such as, ash, dust and/or sand. U.S. Pat. No. 4,418,124 discloses the manufacture of gas turbine engine, spray cast, superalloy airfoils, having a grain size of 0.2 to 0.5 micron, by low pressure high velocity plasma spray-casting in which fine particles of superalloy at just above its melting point are formed at high velocity in a plasma stream onto a substrate in a neutral atmosphere, low pressure chamber. Subsequent heat treatment is necessary and results in grain growth, e.g., to 2 to 3 microns. The resulting airfoils were not tested for erosion resistance which could be expected to approximate the relatively low erosion resistance known for the superalloys used.

U.S. Pat. No. 4,318,672 describes the erosion problem to which fan and turbine blades are exposed and the difficulty of meeting the problem with a single material. This patent teaches the use of two wear-resisting layers as attachments to the blades. One wear-resisting layer is made of a relatively ductile material which is relatively resistant to abrasive particles at impact angles of 45° to 90° but has a maximum erosion sensitivity at impact angles of 15° to 30°. The other wear-resistant material is a relatively hard, brittle material which is relatively resistant to erosion by particles impacting at 0° to 45° but has a maximum erosion sensitivity at impact angles ranging from 75° to 90°. The two wear-resisting layers are superimposed and detachably secured in a cut-out around the leading edge of the blade.

In U.S. Pat. No. 3,699,623, a titanium skin is diffusion bonded to the exterior surface of turbine blades made of aluminum, magnesium or alloys thereof in order to improve erosion resistance.

U.S. Pat. No. 4,492,522 discloses fan or turbine blades made of a ceramic material such as silicon carbide or silicon nitride coated with a layer of TiN, TiC, $B_4C$, BN or titanium carbide nitride applied by chemical vapor deposition (CVD) or physical vapor deposition (PVD). This patent fails to recognize the effect of impact angle on erosion resistance and the coatings taught by this patent may be in some cases more erodible than the ceramic substrate, especially at low impact angles.

A paper included in the Proceedings of the 6th International Conference on Erosion by Liquid and Solid Impact, entitled Erosion Of Corrosion Resistant Coatings For Jet Engine Compressors, H. J. Kolkman, National Aerospace Laboratory NLR of Amsterdam, The Netherlands, reported that soft coatings such as Sermetel 735 (aluminum pigmented basecoat sealed with a topcoat) having an Er(90°)/Er(20°) ratio of less than one on AISI 410 stainless steel substrates provides inadequate or no erosion protection for the substrate.

A Duckworth et al article in *Thin Solid Films*, 63, 1979, pp. 289–297, discloses ZrN coatings deposited by high rate r.f. sputtering of small rod targets at about 1000° C. There is no disclosure or suggestion, however, of a ZrN coated substrate which, in use, has a surface subject to high angle impingement and a surface subject to low angle impingement, such as a turbomachine airfoil. There also is no disclosure or suggestion of a ZrN coating having a controlled grain size of 3,000 Angstroms or less, and the high temperature (1000° C.) used by Duckworth in the deposition of ZrN coatings would in fact encourage the growth of ZrN grains greater than 3000 Angstroms in the coating.

W. D. Sproul in articles published in *Thin Solid Films*, 107, 1983, pp. 141–147, and 118, 1984, pp. 279–284, discloses very thin (i.e., less than about 5 $\mu$m) zirconium nitride coating of tools using a very high rate of reactive sputtering. In a paper submitted to the 1984 AVS National Symposium in Reno, Nev., Sproul disclosed the coating of tools with very thin zirconium nitride by reactive sputtering. K. Salmenoja described in *Vacuum*, 36, 1–3, 1986, pp. 33–35, zirconium nitride coatings prepared by triode ion plating. None of these references, however, disclose or suggest the coating of thicker (i.e., greater than about 5 $\mu$m) zirconium nitride onto a substrate which, in use, has a surface subject to high angle impingement and a surface subject to low angle impingement, such as a turbomachine engine airfoil. There also is no disclosure or suggestion of a zirconium nitride coating having a ratio of erosion rate at an impingement angle of 90° to the erosion rate at an impingement angle of 20° of not greater than 1.5 or having an erosion rate at all impingement angles from 20° to 90° at least two times less than that of the substrate at the same impingement angles.

Hard coatings have been used, heretofore, in efforts to prolong the service life of fan, compressor, or turbine airfoils. However, hard (i.e. brittle) materials, including many carbides, borides, nitrides, oxides and cermets, exhibit the characteristic of substantially lower resistance to 90° erosion when compared with that at low angle erosion, e.g., less than 30°. Typically the erosion rate (Er) of hard and/or brittle materials is a function of the impingement angle of the particle. Therefore, for such a hard coating the ratio of erosion rate at 90° to 20°, Er(90°)/Er(20°), is about 8.5. In such cases, even though the coating is capable of providing significant protection for the fan, compressor or turbine airfoils at low angle erosion, the overall service life of the coated airfoil is determined by the lack of resistance of the coating to 90° erosion.

Detonation gun coatings have been used as protective coatings for compressor airfoils in gas turbine engines. Severe leading edge erosion damage was observed on such coated airfoils after operation in a dust environment. The erosion resistance of these coatings at 20° impingement angle was approximately two times the bare airfoil (Ti-6Al-4V or Inconel-718) but their erosion resistance values at 90° impingement were only about one-half that of the bare airfoil. Clearly, these coatings offer very little protection, or no protection, for those surfaces of compressor airfoils subjected to high angle erosion.

Recently, titanium nitride coatings produced by physical vapor deposition (PVD) arc evaporation process were found to exhibit excellent erosion resistance at both high and low impingement angles and their Er(90°)/Er(20°) value were found to be 2.6 to 3.2. However, the leading edge of titanium nitride coated compressor airfoils suffer substantially higher erosion due to 90° particle impact than do the pressure surfaces of the airfoils even though the total weight loss of the coated airfoil due to erosion may be at least 10 times less than that of an uncoated airfoil.

Accordingly, the present invention provides coated articles having, in use, a surface subject to high angle impingement and a surface subject to low angle impingement, and having a relatively thick zirconium nitride coating having an average grain size of not greater than 3000 Angstroms applied by physical vapor deposition and characterized by having a thickness of at least about 5 μm and having an erosion rate at all impingement angles from 20° to 90° at least about two times less than that of the substrate at the same impingement angles.

SUMMARY OF THE INVENTION

According to the present invention ZrN coatings having an average grain size of not greater than about 3,000 Angstroms applied by physical vapor deposition provide enhanced erosion resistance at all impingement angles from 20° to 90°. This invention provides an erosion resistant article having, in use, a surface subject to high angle impingement and a surface subject to low angle impingement, said article comprising a substrate defining said surfaces composed of a refractory metal, titanium alloy, refractory alloy, aluminum alloy, superalloy based on Fe, Co or Ni, stainless steel or ceramic composite, and an erosion-resistant coating of zirconium nitride having an average grain size of not greater than about 3,000 Angstroms applied by physical vapor deposition to said surfaces, said zirconium nitride coating being at least about 5 μm thick. Preferably the ZrN coating is also characterized by a ratio of the erosion rate at an impingement angle of 90° to the erosion rate at an impingement angle of 20° of not greater than about 1.5 or an erosion rate at all impingement angles from 20° to 90° at least two times less than that of said substrate at the same impingement angles. The smaller the grain size of the ZrN coatings of this invention, the greater the erosion resistance of the coating and, therefore, ZrN coatings having a grain size not greater than about 1,800 Angstroms are preferred and those having a grain size not greater than about 600 Angstroms are most preferred.

The present invention further provides ZrN coatings as described above and further characterized by having a crystal orientation predominantly in the (200) plane, or ZrN coatings having a crystal orientation predominantly in the (111) plane, which have good erosion resistance with a lower ratio of 90° erosion rate to 20° erosion rate. ZrN coatings having an intensity ratio I(200)/I(111) of greater than about 8 or those having an intensity ratio I(111)/I(200) of greater than about 20 are preferred.

It has been observed also in this invention that the high angle (e.g. 90°) impact erosion resistance of polycrystalline ZrN coatings and the character of the erosion mechanism are a function of the residual coating stress as determined by the interplanar spacing, $d_{111}$, of the (111) diffraction planes in the case where crystal orientation is predominantly in the (111) plane or the interplanar spacing, $d_{200}$, of the (200) diffraction planes in the case where crystal orientation is predominantly in the (200) plane. Accordingly, the high angle impact erosion resistance and mechanism of the polycrystalline ZrN can be controlled by controlling the interplanar spacing of the (111) planes or of the (200) planes.

There is a maximum interplanar spacing, $d_{111}$, or $d_{200}$, for the polycrystalline ZrN coatings, below which uniformly eroded surfaces and lower erosion rates have been observed when subjected to high angle (90°) impact erosion and above which relatively large erosion pits due to intracoating spalling and relatively higher erosion rates occur in the eroded surfaces of the coatings. At or below an interplanar spacing, $d_{111}$, of about 2.660 Angstroms for ZrN coatings having a crystal orientation predominantly in the (111) plane, or, at or below an interplanar spacing, $d_{200}$, of about 2.292 Angstroms for ZrN coatings having a crystal orientation predominantly in the (200) plane, uniformly eroded surfaces and relatively lower erosion rates have been observed after being subjected to high angle (90°) impact erosion whereas above these approximate values intracoating spalling and relatively higher rates of erosion have been experienced. The intracoating spalling, generally leading to the material removal in large flakes, can cause early or catastrophic failures.

BRIEF DESCRIPTION OF THE DRAWINGS

The present invention will be best understood by reference to the accompanying drawings wherein:

FIG. 5 is a graph illustrating the effect of intensity ratios, I(200)/I(111) or I(111)/I(200), of ZrN coatings of this invention on the ratio of high angle impingement erosion rate to low angle impingement erosion rate, Er(90°)/Er(20°).

DESCRIPTION OF THE PREFERRED EMBODIMENT

Figure 1:
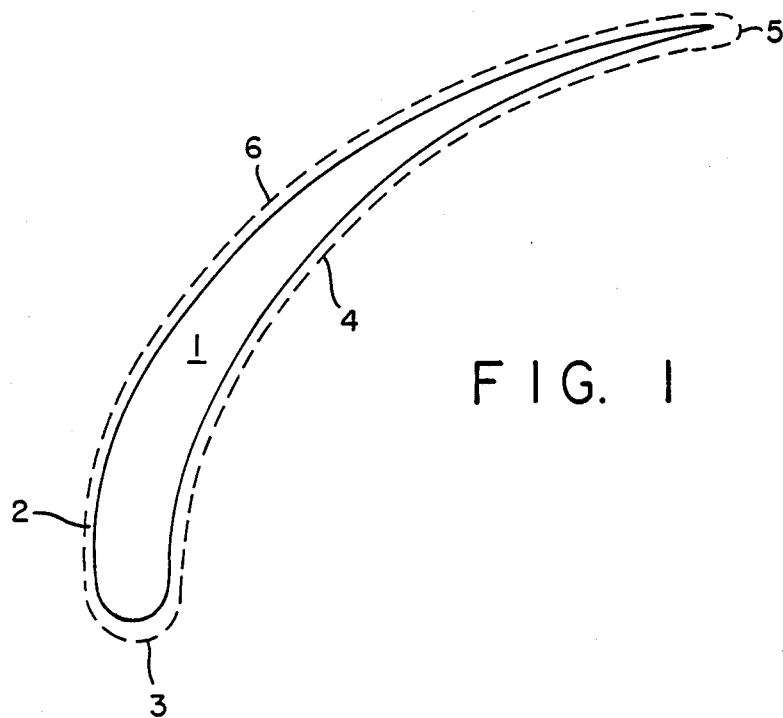
FIG. 1 is a diagrammatic cross section of a turbomachine airfoil taken at the cord which is provided with an erosion resistant ZrN coating of this invention wherein the thickness of said coating is exaggerated for clarity.

FIG. 1 shows a cord width profile of a turbomachine airfoil having a substrate 1 formed in a suitable shape for said airfoil and a relatively thick ZrN coating 2 bonded to all surfaces of the airfoil including the leading edge 3, the pressure surface 4, the trailing edge 5 and the suction surface 6. It is to be understood by those skilled in the art that the entire airfoil cord circumference can be encapsulated as shown in FIG. 1, that the coating can be limited to the leading edge, pressure surface and trailing edge, that the coating can be limited to any portion of the airfoil axial length (i.e., the direction perpendicular to the cord cross section shown in FIG. 1) and that the coating can also be applied to the termination end or tip (i.e., in the plane of the cord cross section shown in FIG. 1) of fan blades, compressor blades, turbine blades, impellers, vanes and diffusers. The ZrN coating 2 is applied to the substrate 1 by any suitable physical vapor deposition apparatus or process and preferably is applied by means of the physical vapor deposition process and apparatus described in the above-identified, parent application Ser. No. 905,510, filed Sept. 10, 1986, the disclosure of which is incorporated herein by reference.

The coating 2 in FIG. 1 is shown, of course, at a greatly exaggerated thickness but it illustrates the relative thicknesses of the coating at various locations on the surface of the blade. In the PVD process, the deposition rate at the leading edge 3 and trailing edge 5 of the blade is greater, e.g., at least about 1.5 times the deposition rate on either the pressure surface 4 or the suction surface 6 of the airfoil due to concentration of the electrical field at the leading and trailing edges. Thus, if the thickness of the coating at the leading edge 3 is maintained at 1.5 or less times the thickness of the coating at the pressure surface 4, the erosion rate ratio Er(90°)/Er(20°) of the coating must be limited to be about 1.5 or less to assure that coating remains on the leading edge 3 as long as there is coating remaining on pressure surface 4. Since the leading edge 3 is mainly subjected to 90° erosion while the pressure surface 4 is mainly exposed to low angle erosion, e.g. 20°-30° erosion, the erosion rate ratio Er(0°)/Er(20°) must be no more than the ratio of the thickness at the leading edge 3 as compared to the thickness at the pressure surface 4 when the area where the coating is thinner erodes at a slower rate than the area where the coating is thicker, e.g., at the leading edge 3. In order to avoid intracoating spalling, the thickness of the coating at the leading edge 3 is limited to a maximum below which no intracoating spalling occurs. From both aerodynamic and economic standpoints, the thinnest, effective coatings are preferred. Representative thicknesses of the coating on the pressure surface 4 are at least about 5 $\mu$m and can range from about 5 to about 20 $\mu$m, preferably about 10-15 $\mu$m. There are many different ways known in the art for controlling the thickness of PVD coatings at areas such as the leading edge 3 or trailing edge 5 where it tends to be at least about 1.5 times the thickness of the coating on the pressure surface 4. For example, sacrificial electrodes can be located adjacent these areas to draw coating away and/or the airfoil can be oriented with respect to the cathode in a manner to minimize the excess coating thickness at the leading edge 3 or trailing edge 5 and maximize the thickness on the pressure surface 4. In addition, the coating thickness can be adjusted by the bias voltage applied to the blade, higher bias voltages providing thinner coatings. Any other suitable means known to those skilled in the art for adjusting and controlling thickness on the blade can be employed.

The grain size of the ZrN coating can be controlled by controlling the temperature at which the ZrN coating is deposited on the substrate. The ZrN coatings 2 have a grain size of about 3000 Angstroms or less, preferably about 1800 Angstroms or less and most preferably about 600 Angstroms or less. For purposes of this invention, grain sizes less than 2000 Angstroms are determined by conventional x-ray diffraction techniques using the Scherrer formula described in "Elements of X-ray Diffraction", B. D. Cullity, Addison-Wesley, Reading, Mass., 1965, which, effectively, provides the average of the maximum dimensions of a large number of grains. Scanning electron microscope (SEM) techniques are used to measure grain sizes greater than 2000 Angstroms. In the SEM technique, an electron micrograph is taken of a fracture surface or etched surface of the test specimen. The maximum dimensions of a large number of grains (e.g., 100, more or less) are visually measured, totaled and divided by the number of grains measured to provide the average grain size.

Deposition temperature is the temperature of the substrate during deposition of the ZrN coating. The grain size of the ZrN coating increases with increasing deposition temperatures. Thus, in order to provide the smallest possible grain sizes, the lowest possible temperatures must be used. Deposition temperatures ranging from about 300° C. to about 900° C. can be utilized, preferably the deposition temperature should be maintained in the range of 350° to 750° C. Deposition temperature can be controlled by adjustment of operating parameters such as evaporator current, bias voltage and spatial standoff.

Figure 2:
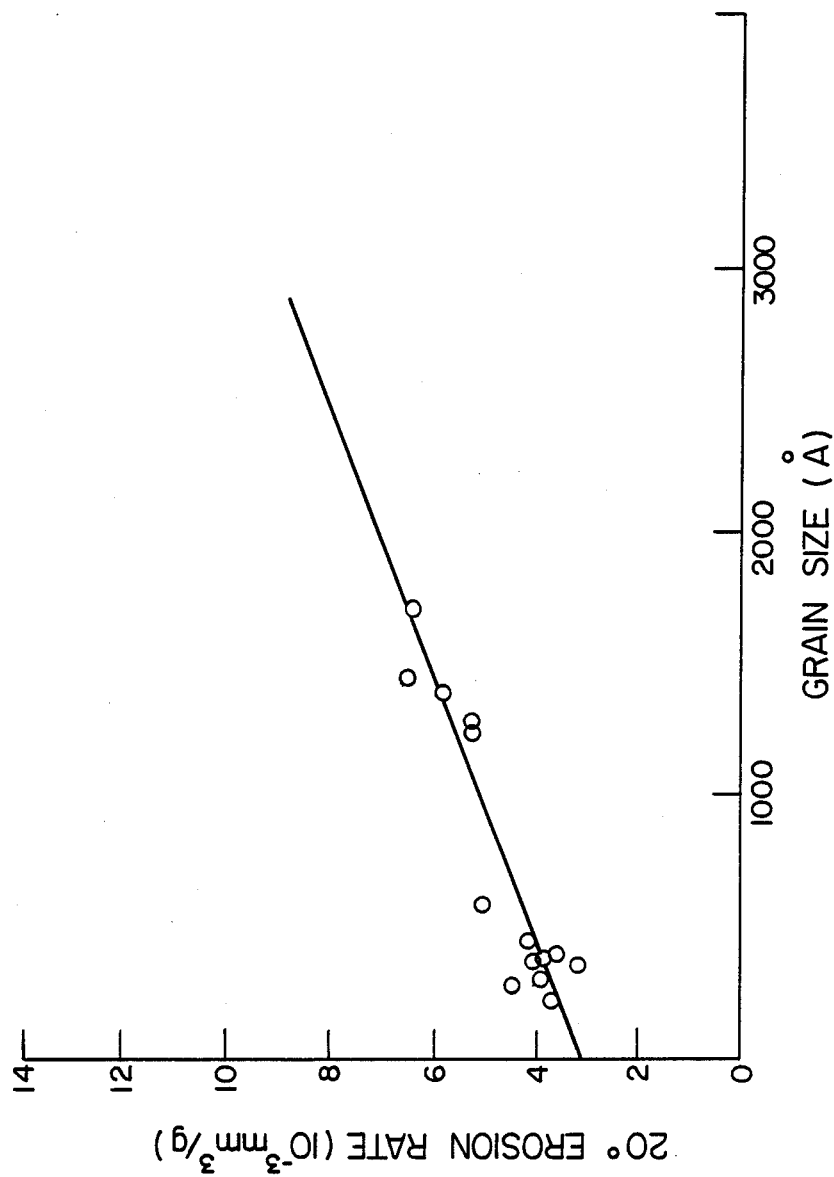
FIG. 2 is a graph illustrating the effect of grain size of ZrN coatings of this invention on erosion rate at a 20° angle of impingement.
Figure 3:
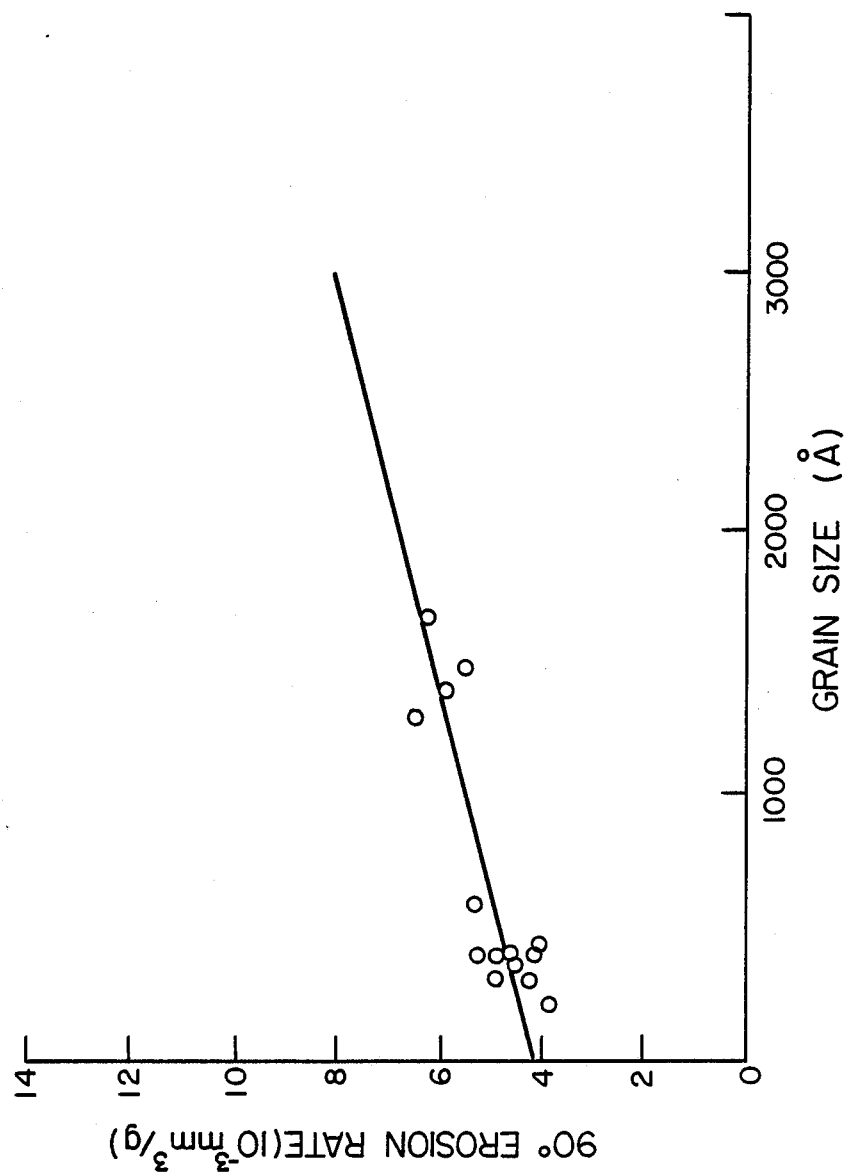
FIG. 3 is a graph illustrating the effect of grain size of ZrN coatings of this invention on erosion rate at a 90° angle of impingement.

The effects of smaller grain size of the ZrN coatings in reducing the erosion rate of the coating are illustrated in FIGS. 2 and 3 which show the effects of grain size on erosion rate for the low impingement angle of 20° (FIG. 2) as well as for the 90° impingement angle (FIG. 3). The erosion rate of the coatings was determined by a test, hereinafter referred to as the "50 $\mu$m alumina impact test", using test apparatus based on ASTM G76-83 guidelines and using compressed air at 248 KPa to deliver at least a 200 g charge of angular 50 $\mu$m alumina particles through a 5 mm diameter nozzle at a nominal rate of 450 g/min with a nominal velocity of 60 m/s and a nozzle-to-test specimen standoff of 10 cm at an impact angle of 20° or 90° to the specimen surface. The erosion rate (Er) of the coating is measured in terms of the volume loss of coating per unit gram of alumina particles that impacted the test specimen. Approximately 600-800 g of alumina was used for the 20° impingement erosion test and about 200-300 g of alumina was used in the 90° impingement erosion test. FIGS. 2 and 3 clearly demonstrate that both 20° and 90° erosion rates decline as the grain size of the zirconium nitride coating decreases.

Figure 4:
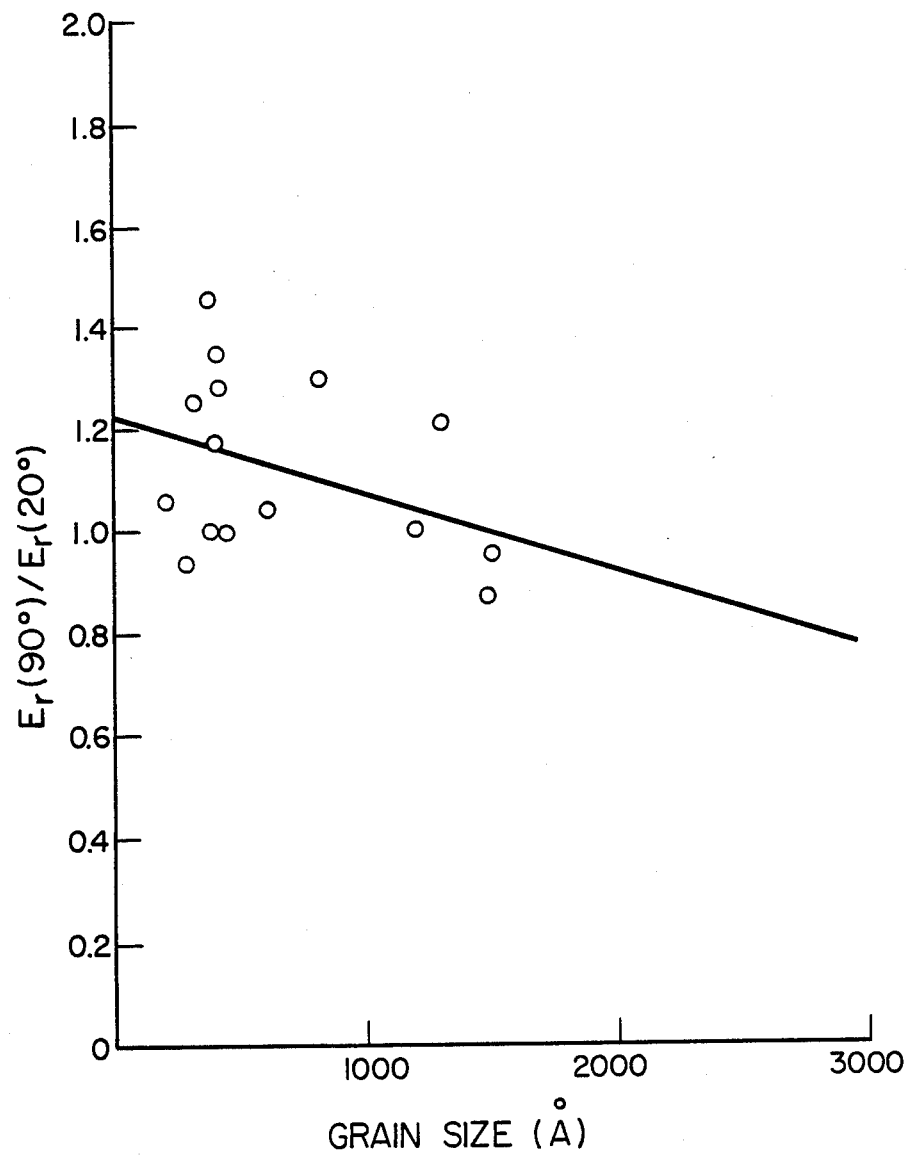
FIG. 4 is a graph illustrating the effect of grain size of ZrN coatings of this invention on the ratio of high angle impingement erosion rate to low angle impingement erosion rate, Er(90°)/Er(20°)

FIG. 4 illustrates the effect of grain size on the ratio of the erosion rate at 90° impingement to the erosion rate at 20° impingement, Er(90°)/Er(20°) FIG. 5 illustrates the effects of the intensity ratio of x-ray diffraction intensity from the (111) plane to x-ray diffraction intensity from the (200) plane, i.e., I(111)/I(200), of a ZrN coating having crystal orientation predominantly in the (111) plane designated by the solid line designated "ZrN(111)," on the ratio of erosion resistance at 90° to the erosion resistance at 20° impingement. FIG. 5 also illustrates the effect of the ratio of x-ray diffraction intensity from the (200) plane to the x-ray diffraction intensity from the (111) plane, i.e., I(200)/I(111), on the ratio of erosion rate at 90° to the erosion rate at 20° impingement as illustrated by the dash line designated "ZrN (200)." FIG. 5 clearly shows that the erosion rate at 90° impingement angle decreases more rapidly than the erosion rate at 20° impingement angle as the intensity ratio I(111)/I-(200) or I(200)/I(111) increases. FIG. 5 also shows that the high angle (90°) erosion rate of titanium nitride coatings applied by PVD is considerably greater than the erosion rate at a 20° impingement angle. Even though the ratio of high angle erosion rate to low angle erosion rate for TiN decreases as the intensity ratio I(111)/I(200) increases, in practice the ratio never reaches the values for ZrN coatings.

A unique characteristic of the ZrN coated articles is that the erosion rate ratio, Er(90°)/Er(20°), is less than about 1.5. The value of Er(90°)/Er(20°) of the ZrN coating is a function of the grain size and crystallographic orientation. Er(90°)/Er(20°) decreases linearly with increasing grain size from a ratio of 1.18 at 400 Angstroms to a ratio of 0.92 at 2000 Angstroms, with increasing log I(111)/I(200) from a ratio of 1.5 at I(111)/I(200)=1 to a ratio of 0.8 at I(111)/I(200)=95, or with increasing log I(200)/I(111) from a ratio of 1.5 to I(200)/I(111)=1 to a ratio of 0.85 at I(200)/I(111)=20.

For the maximum erosion protection of the article, e.g., the turbomachine airfoil, the ZrN coating should be characterized by (a) interplanar spacing $d_{111} \leq 2.660$ Angstroms or $d_{200} \leq 2.292$ Angstroms, (b) grain size less than about 3000 Angstroms, preferably less than about 1800 Angstroms and most preferably less than about 600 Angstroms, and (c) high I(111)/I(200) or I(200)/I(111) ratio.

The novel coated articles of this invention are comprised of ZrN coatings having the crystallographic properties described herein deposited on any of a number of substrate materials such as refractory metals and alloys including Cr, V, Ta, Mo, Nb and W, superalloys based on Fe, Co or Ni including Inconel 718, Inconel 738, Waspaloy and A-286, stainless steels including 17-4PH, AISI 304, AISI 316, AISI 403, AISI 422, AISI 410, AM 350 and AM 355, Ti alloys including Ti-6Al-4V and Ti-6Al-2Sn-4Zr-2Mo and Ti-8Al-1Mo-1V, aluminum alloys including 6061 and 7075, WC-Co Cermet, and $Al_2O_3$ ceramics The above-identified substrates are described in detail in *Materials Engineering/Materials Selector '82*, published by Penton/IPC, subsidiary of Pittway Corporation, 1111 Chester Ave., Cleveland, Ohio 44114, in 1981, and *Alloy Digest*, published by Alloy Digest, Inc., Post Office Box 823, Upper Montclair, N.J., in 1980. Furthermore, any substrate that is able to withstand the temperatures and other conditions of the PVD process can be used in the manufacture of articles of this invention.

Table 1 provides the erosion rates at 90° impingement angle and the erosion rates at 20° impingement angle measured using the "50 μm alumina impact test" for several materials as compared with the corresponding erosion rates of zirconium nitride coatings of the present invention having average grain sizes of less than 2000 Angstroms as shown in FIGS. 2 and 3.

TABLE 1

| Material | Erosion Rate ($10^{-3} mm^3/g$) | | Er(90°)/Er(20°) |
|---|---|---|---|
| | Er(90°) | Er(20°) | |
| Ti—6Al—4V | 21.3 | 46.4 | 0.46 |
| 17-4 PH | 16.8 | 32.5 | 0.52 |
| Inconel 718 | 17.4 | 28.6 | 0.61 |
| ZrN | 4.1–6.5 | 3.1–6.5 | 0.8–1.5 |
| TiN | 8.0 | 2.5 | 3.2 |
| WT-1* | 32.3 | 17.4 | 2.0 |

*83(W,Ti) carbide + 17 Ni

In the results shown in Table 1, the WT-1 material was a detonation gun coating. The TiN coating had a $d_{111}$ of 2.455 Angstroms and an intensity ratio I(111)/I(200) of 620. The results given in Table 1 show that substrate materials such as 17-4 PH, Ti-6Al-4V and Inconel 718 exhibited typical ductile erosion, i.e., greater low angle erosion rate than high angle erosion rate, or, in other words, having a relatively low Er(90°)/Er(20°) ratio, namely, below about 0.61. On the other hand, the TiN and WT-1 exhibited typical brittle erosion wherein the Er(90°)/Er(20°) ratio was 2 or more. The ZrN coatings, however, had an Er(90°)/Er(20°) ratio of 0.8 to 1.5. Compared with the substrate materials Such as 17-4 PH, Ti-6Al-4V and Inconel 718, the erosion resistance of the ZrN coating is at least about 4.4 and 2.6 times that of said substrate materials for 20° and 90° erosion, respectively. In addition, as shown in FIGS. 2 and 3, all ZrN coatings with a grain size less than about 3000 Angstroms have erosion resistance at least about 2 times the erosion resistance of the substrate materials of Table 1 at both erosion impact angles. The results given in Table 1 and FIGS. 2 and 3 indicate that the erosion resistance of the ZrN coatings of this invention is substantially insensitive to impingement angles. Consequently, the novel combination of airfoils and ZrN coatings having an average grain size less than about 3000 Angstroms will resist erosion more equally than coated airfoils heretofore known. Furthermore, the maximum service life of airfoils can be achieved in practice by balancing the Er(90°)/Er(20°) ratio of the ZrN coating with its thickness distribution on the blade. Thus, when a ZrN coating having an Er(90°)/Er(20°) ratio of 1.5 or less is used, it can be deposited so as to provide a thickness of ZrN coating on the leading edge (where impact angles are high) that is at least about 1.5 times the thickness of the coating on the other airfoil surfaces including the pressure surface where impact angles are low.

In addition, the zirconium nitride coatings provide enhanced erosion resistance at high temperatures in addition to a high level of corrosion resistance. Furthermore, zirconium nitride coatings are resistant to flexing fatigue and are capable of coating sharp corners or edges of airfoils.

EXAMPLES 1 AND 2

Examples 1 and 2 further illustrate the invention as carried out by the process and apparatus described in the parent application Ser. No. 905,510, filed Sept. 10, 1986, using the materials and process parameters given in Table 2 below to produce ZrN coated substrates having coatings which possess crystal orientations predominantly in the (111) plane or in the (200) plane, respectively. (Dimension "x" is the depth of the cathode recess, i.e., the distance from the cathode to the opening of the cathode shield, of the apparatus described in the above-mentioned parent application.) In addition, the interplanar spacing values, $d_{111}$, or $d_{200}$, the intensity ratios, $I(111)/I(200)$, or $I(200)/I(111)$, the grain sizes of the ZrN coatings and the 90° and 20° volume erosion rates are given in Table 2 for each of Examples 1 and 2.

TABLE 2

|  | Example 1 | Example 2 |
|---|---|---|
| Coating Composition | ZrN | ZrN |
| Grain Size | 1400 Angstroms | 290 Angstroms |
| I(111)/I(200) | 55 | — |
| I(200)/I(111) | — | 8 |
| $d_{111}$ | 2.656 Angstroms | —Angstroms |
| $d_{200}$ | —Angstroms | 2.290 Angstroms |
| 90° Volume Erosion Rate | $5.7 \times 10^{-3}$ mm³/g | $4.2 \times 10^{-3}$ mm³/g |
| 20° Volume Erosion Rate | $5.6 \times 10^{-3}$ mm³/g | $4.0 \times 10^{-3}$ mm³/g |
| Substrate | Inconel 718 | Ti—6Al—4V |
| Cathode Composition | Zr | Zr |
| Cathode (Cylindrical) Diameter | 6.35 cm | 6.35 cm |
| Dimension "x" | 2.6 cm | 3.8 cm |
| Spatial Standoff | 30 cm | 36 cm |
| Chamber Pressure | 0.042 torr | 0.036 torr |
| N₂ Gas Flow | 215 sccm | 185 sccm |
| Arc Current | 139 Adc | 144 Adc |
| Substrate Bias | 250 Vdc | 50 Vdc |
| Deposition Rate | 0.09 μm/min | 0.08 μm/min |
| Substrate Temp. (during deposition) | 670° C. | 415° C. |
| ZrN Coating Thickness On Pressure Surface | 15 μm | 10 μm |

What we claimed is:

1. An erosion resistant article comprising a substrate chosen from the group consisting of refractory metal, titanium alloy, refractory alloy, aluminum alloy, superalloy based on Fe, Co, or Ni, stainless steel, and ceramic composite, and a coating upon the surface of the substrate of zirconium nitride, said coating having a thickness of at least about 5 μm, and an average grain size of less than 3000 Angstroms.

2. An article as claimed in claim 1 wherein the zirconium nitride coating has an average grain size less than 1800 Angstroms.

3. An article as claimed in claim 1 wherein the zirconium nitride coating has an average grain size less than about 600 Angstroms.

4. An article as claimed in claim 1 wherein the erosion rates of impingement angles between 20° and 90° are less than one half of the erosion rate of the same metallic or ceramic substrate without a coating upon its surface.

5. An article as claimed in claim 1 wherein the ratio of the erosion rate of the zirconium nitride coating at an impingement angle of 90° to the erosion rate of the zirconium nitride coating at an impingement angle of 20° is less than 1.5, the erosion rates as determined by the 50 μm alumina impact test.

6. An article as claimed in claim 1 wherein the ratio of the erosion rate of the zirconium nitride coating at an impingement angle of 90° to the erosion rate of the zirconium nitride coating at an impingement angle of 20° is between 0.8 and 1.5, the erosion rates as determined by the 50 μm alumina impact test.

7. An article as claimed in claim 1 wherein the zirconium nitride coating has a crystal orientation predominantly in the (111) plane.

8. An article as claimed in claim 7 wherein the zirconium coating has an x-ray diffraction interplanar spacing, $d_{111}$, less than 2.66 Angstroms.

9. An article as claimed in claim 8 wherein said zirconium nitride coating has an I(11)/I(200) x-ray diffraction intensity ratio of not less than about 20.

10. An article as claimed in claim 1 wherein the zirconium nitride coating has a crystal orientation predominantly in the (200) plane.

11. An article as claimed in claim 10 wherein the zirconium coating has an x-ray diffraction interplanar spacing, $d_{200}$, less than 2,292 Angstroms.

12. An article as claimed in claim 11 wherein said zirconium nitride coating has an I(200)/I(111) x-ray diffraction intensity ratio of not less than about 8.

13. An article as claimed in claim 1, wherein the article is an moving airfoil of a turbomachine.

14. An article as claimed in claim 13 wherein the article is an impeller.

15. An article as claimed in claim 1, wherein the article is a stationary airfoil of a turbomachine.

16. An article as claimed in claim 15 wherein said article is a compressor vane.

17. An article as claimed in claim 13 wherein the article is fully encapsulated with the zirconium nitride coating.

18. An article as claimed in claim 13 wherein the airfoil is coated with the zirconium nitride coating upon its tip.

* * * * *